United States Patent
Chang et al.

(10) Patent No.: US 7,372,102 B2
(45) Date of Patent: May 13, 2008

(54) STRUCTURE HAVING A SHALLOW TRENCH-DEEP TRENCH ISOLATION REGION FOR A BICMOS/CMOS TECHNOLOGY

(75) Inventors: Kuan-Lun Chang, Hsin-Chu (TW);
Ruey-Hsin Liu, Hsin-Chu (TW);
Tsyr-Shyang Liou, Hsin-Chu (TW);
Chih-Min Chiang, Hsin-Chu (TW);
Jun-Lin Tsai, Hsin-Chu (TW)

(73) Assignee: Taiwan Semiconductor Manufacturing Company, Ltd, Hsin-Chu (TW)

(*) Notice: Subject to any disclaimer, the term of this patent is extended or adjusted under 35 U.S.C. 154(b) by 92 days.

(21) Appl. No.: 11/272,259

(22) Filed: Nov. 10, 2005

(65) Prior Publication Data
US 2006/0063389 A1   Mar. 23, 2006

Related U.S. Application Data

(62) Division of application No. 10/772,940, filed on Feb. 5, 2004, now Pat. No. 7,015,086.

(51) Int. Cl.
*H01L 29/76* (2006.01)
(52) U.S. Cl. ................... 257/330; 438/270
(58) Field of Classification Search ........ 257/328–330, 257/332, 343, E27.091, E29.201; 438/259, 438/270
See application file for complete search history.

(56) References Cited

U.S. PATENT DOCUMENTS

| 5,895,253 | A  |   | 4/1999 | Akram |
|---|---|---|---|---|
| 6,110,794 | A  |   | 8/2000 | Liu |
| 6,188,104 | B1 | * | 2/2001 | Choi et al. ............ 257/330 |
| 6,194,287 | B1 |   | 2/2001 | Jang |
| 6,214,696 | B1 |   | 4/2001 | Wu |
| 6,232,043 | B1 |   | 5/2001 | Lin et al. |
| 6,255,184 | B1 |   | 7/2001 | Sune |
| 6,413,835 | B1 |   | 7/2002 | Norstrom et al. |
| 7,061,047 | B2 | * | 6/2006 | Ono et al. ............ 257/330 |

\* cited by examiner

*Primary Examiner*—David Vu
(74) *Attorney, Agent, or Firm*—Haynes Boone, LLP

(57) ABSTRACT

A structure having a shallow trench-deep trench isolation region for a semiconductor device is provided.

12 Claims, 6 Drawing Sheets

STRUCTURE HAVING A SHALLOW TRENCH-DEEP TRENCH ISOLATION REGION FOR A BICMOS/CMOS TECHNOLOGY

RELATED APPLICATION

This application is a divisional of U.S. patent application Ser. No. 10/772,940, filed Feb. 5, 2004, and entitled "Structure Having a Shallow Trench-Deep Trench Isolation Region for a BiCMOS/CMOS Technology," and is related to U.S. patent application Ser. No. 11/272,260, filed on Nov. 10, 2005, and entitled "Method of Forming a Shallow Trench-Deep Trench Isolation Region for a BiCMOS/CMOS Technology," which is also a divisional of U.S. patent application Ser. No. 10/772,940, both of which are incorporated herein by reference.

BACKGROUND

Bipolar devices offer increased performance when compared to counterparts such as complimentary metal oxide semiconductor (CMOS) devices, therefore designs featuring a combination of fast, bipolar devices, with CMOS devices, are now being implemented. The implementation of bipolar—CMOS (BiCMOS), technology does however require additional features not needed for CMOS only devices. For example due to the shallow depth of CMOS features, only shallow trench regions are needed for isolation of specific CMOS regions, however the deeper features and regions used with the bipolar technology require a greater depth for adequate isolation. Junction isolation can be used for devices needing the deeper isolation regions, however the capacitance generated with this type of isolation adversely influences performance, therefore deep trench isolation has emerged as the logical choice for isolation for bipolar technologies, with a shallow trench-deep trench combination used for BiCMOS devices.

The definition of, and the filling of, deep trench features can result in unwanted topographies. The topography created by deep trench regions, either extending above or below the top surface of a semiconductor substrate, can allow formation of conductive rails on surfaces exposed on the raised or recessed trenches, conceivably resulting in leakage or shorts between devices intended to be isolated via the deep trench procedure. The unwanted rails formed from deposition of a conductive material such as polysilicon, on the raised or recessed deep trench sides, remain after anisotropic dry etching procedures are performed to define a device feature in the conductive material. Therefore to successfully employ deep trench, or a combination of shallow and deep trench technology, the presence of a smooth top surface topography, at the conclusion of the isolation definition procedure is imperative.

WRITTEN DESCRIPTION

Figure 1:
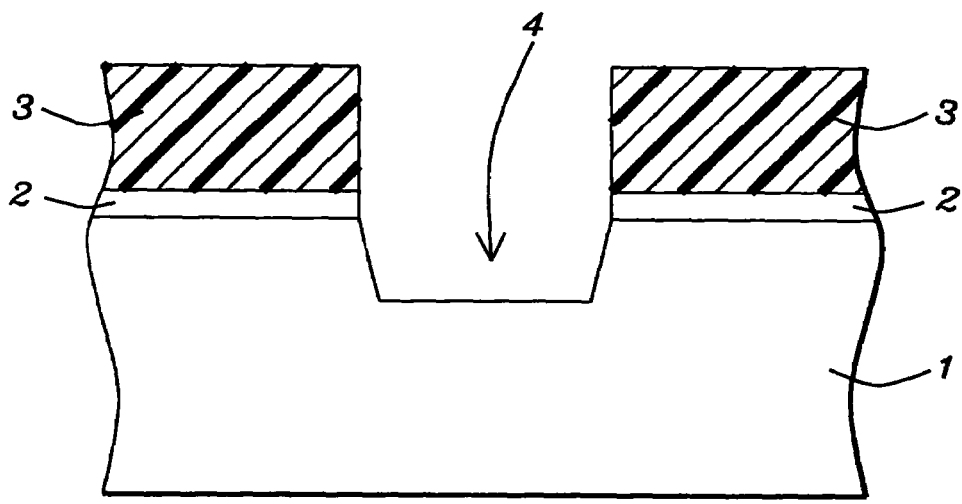
FIGS. 1-13 schematically, in cross-sectional style, describe stages used to fabricate a shallow trench-deep trench isolation region, featuring a combination of polishing, insulator filling, and patterning procedures employed to form a smooth top surface topography for the isolation region, and for the adjacent active device region.

The method used to from a shallow trench-deep trench isolation region, featuring a combination of polishing, insulator filling, and patterning procedures employed to obtain a smooth top surface topography for the isolation region, will now be described in detail. Semiconductor substrate 1, comprised of P type single crystalline silicon, featuring a <100> crystallographic orientation, is used and schematically shown in FIG. 1. Silicon nitride layer 2, is deposited at a thickness between about 1100 to 2000 Angstroms, via low pressure chemical vapor deposition (LPCVD), or via plasma enhanced chemical vapor deposition (PECVD), procedures. Photoresist shape 3, is then used as an etch mask allowing a dry etch procedure to define shallow trench opening 4, in silicon nitride layer 3, and to a depth between about 3000 to 5000 Angstroms in a top portion of semiconductor substrate 1. The dry etching procedure is accomplished using $Cl_2$ as an etchant for both silicon nitride and silicon, with an isotropic component of the dry etching procedure allowing the shallow trench shape to be formed with tapered sides. The result of these procedures is schematically shown in FIG. 1.

Figure 2:
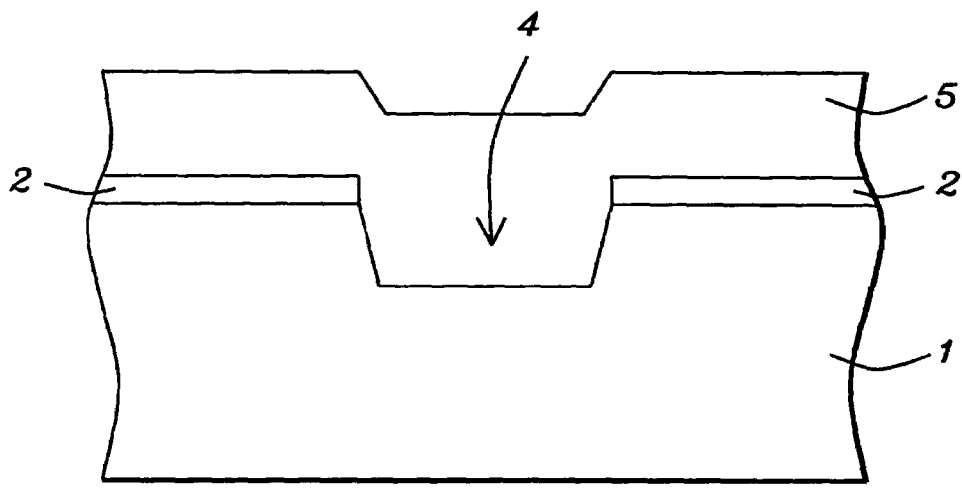
Figure 3:
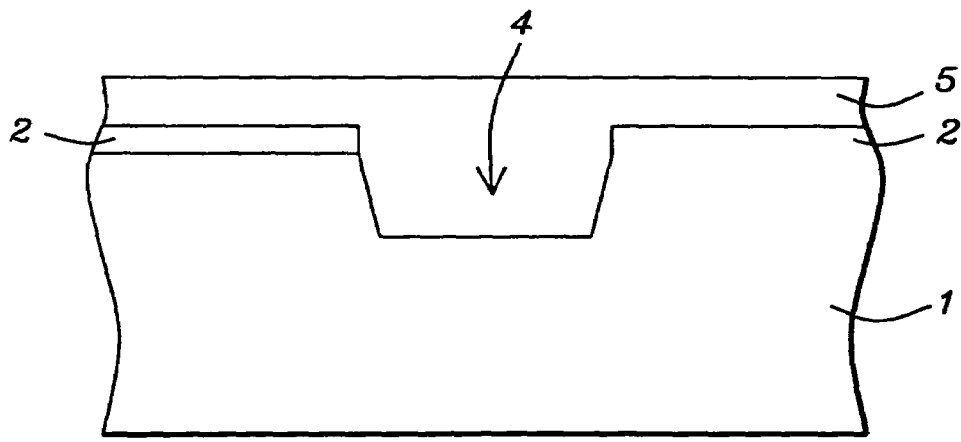

After removal of photoresist shape 3, via plasma oxygen ashing procedures, a silicon dioxide liner layer, (not shown in the drawings), is thermally grown on the exposed surfaces of shallow trench opening 4. Silicon oxide layer 5, is next deposited via a high density plasma (HDP), procedure, to a thickness between about 8000 to 10000 Angstroms, completely filling shallow trench opening 4. The HDP procedure, performed using tetraethylorthosilicate (TEOS), as a source, provides silicon oxide filling characteristics superior to filling characteristics of other modes of deposition such as PECVD or LPCVD procedures. This is schematically shown in FIG. 2. A first chemical mechanical polishing (CMP), procedure is next employed to remove a top portion of silicon oxide layer 5, resulting in between about 1000 to 3000 Angstroms of silicon oxide layer 5, remaining on the top surface of silicon nitride layer 2, and more importantly resulting in a planarized top surface topography. The result of the first CMP procedure is schematically shown in FIG. 3.

Figure 4:
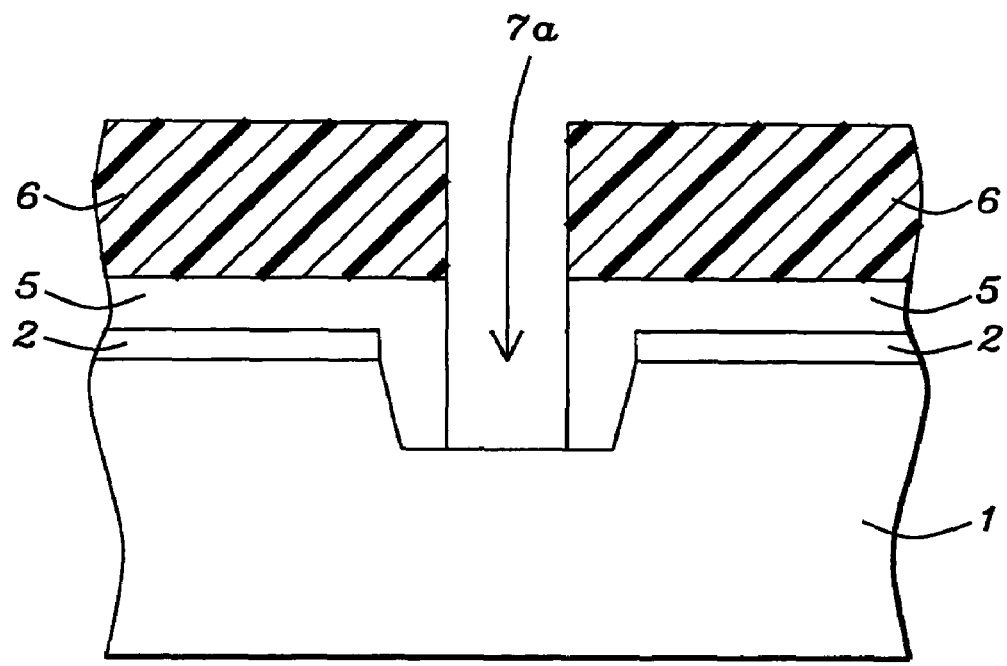

The presence of the planarized silicon oxide surface reduces the severity for definition of a narrow width, deep trench feature in silicon oxide layer 5, via photolithographic and anisotropic reactive ion etching (RIE), procedures. Photoresist shape 6, is formed on the planarized top surface of silicon oxide layer 5, and used as a mask to allow an anisotropic RIE procedure to define trench shape 7a, in silicon oxide layer 5, in a region in which silicon oxide layer 5, resides in shallow trench shape 4. This is accomplished using $CHF_3$ as a selective etchant for silicon oxide, terminating at the appearance of semiconductor substrate 1. The diameter or width of trench shape 7a, shown schematically in FIG. 4, is between about 0.5 to 1.6 um.

Figure 5:
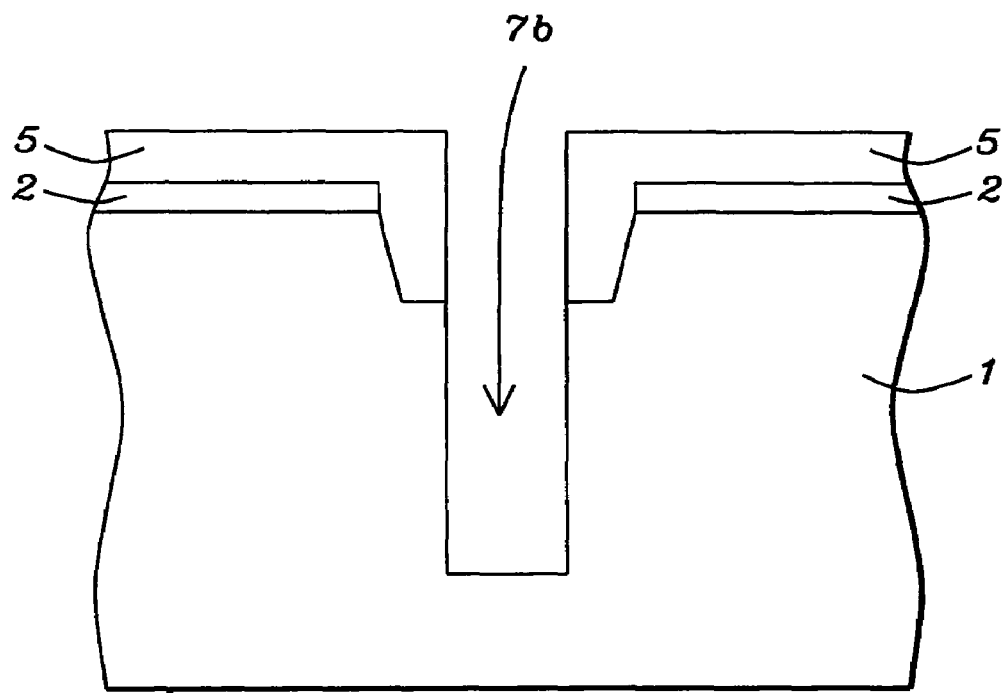

After removal of photoresist shape 6, via plasma oxygen ashing, another anisotropic RIE procedure is employed to selectively remove silicon exposed in trench shape 7a, resulting in the definition of deep trench shape 7b, now defined in silicon oxide layer 5, and in a top portion of semiconductor substrate 1. The selective RIE procedure is performed using $Cl_2$ s an etchant for silicon, with the high etch rate ratio of silicon to silicon oxide, between about 10 to 1, to 5 to 1, allowing silicon oxide layer 5, to perform as an etch mask. The depth of deep trench shape 7b, in semiconductor substrate 1, is between about 4 to 10 um. Since this isolation is designed for BiCMOS technologies, the bottom of the deep trench opening has to be formed below the depth of the deepest bipolar regions such as sub-collector regions, to insure adequate isolation between bipolar elements, or between bipolar and CMOS elements. The result of this procedure is schematically shown in FIG. 5.

Figure 6:
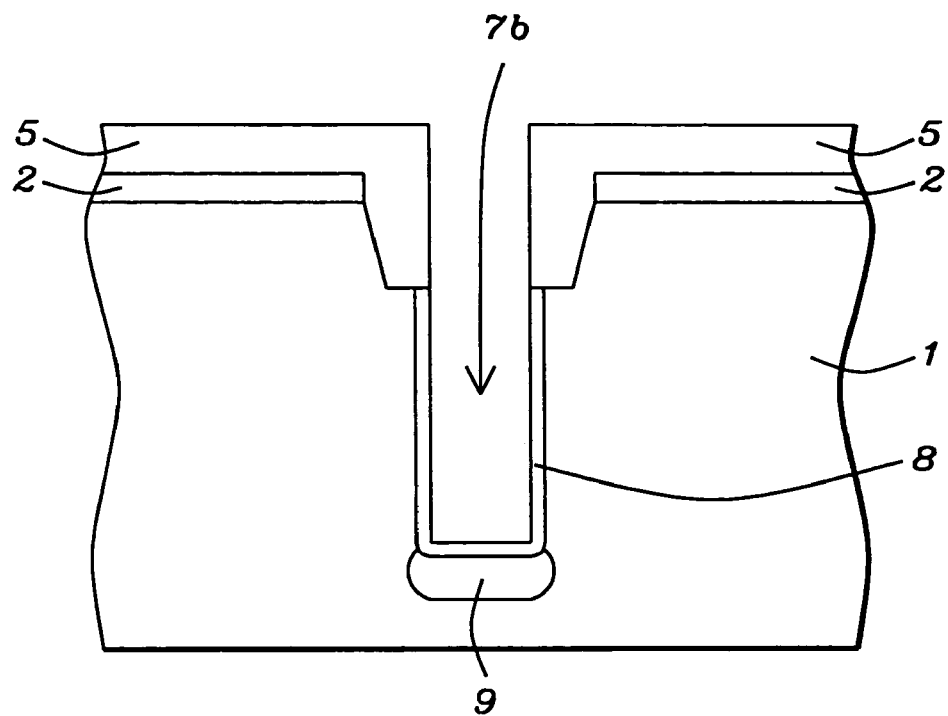

Silicon dioxide layer 8, is next thermally grown, to a thickness between about 50 to 1000 Angstroms, on the sides of semiconductor substrate 1, exposed in deep trench shape 7b. This is accomplished at a temperature between about 800 to 1200° C., in an oxygen-steam ambient. An ion implantation procedure is next employed to form channel stop region 9, in a portion of semiconductor substrate 1, located directly underlying the bottom of deep trench shape 7b. The implantation procedure is performed using boron or $BF_2$ ions, at an implant energy between about 3 to 90 KeV, at a dose between about 1E12 to 1E15 atoms/cm$^2$, and using a zero implant angle, allowing $P^+$ channel stop region 9, to be formed under silicon dioxide layer 8, at the bottom of deep trench shape 7b. This is schematically shown in FIG. 6. Positive charge in silicon dioxide layer 8, can invert the lightly doped adjacent regions of P type semiconductor substrate to a N type layer around the bottom portion of the deep trench shape, possibly providing an unwanted leakage path between N type sub-collector regions, located on each side of deep trench shape 7b. However the higher concentration of P type dopant provided by channel stop region 9, prevents inversion of this region thus preventing the unwanted leakage.

Figure 7:
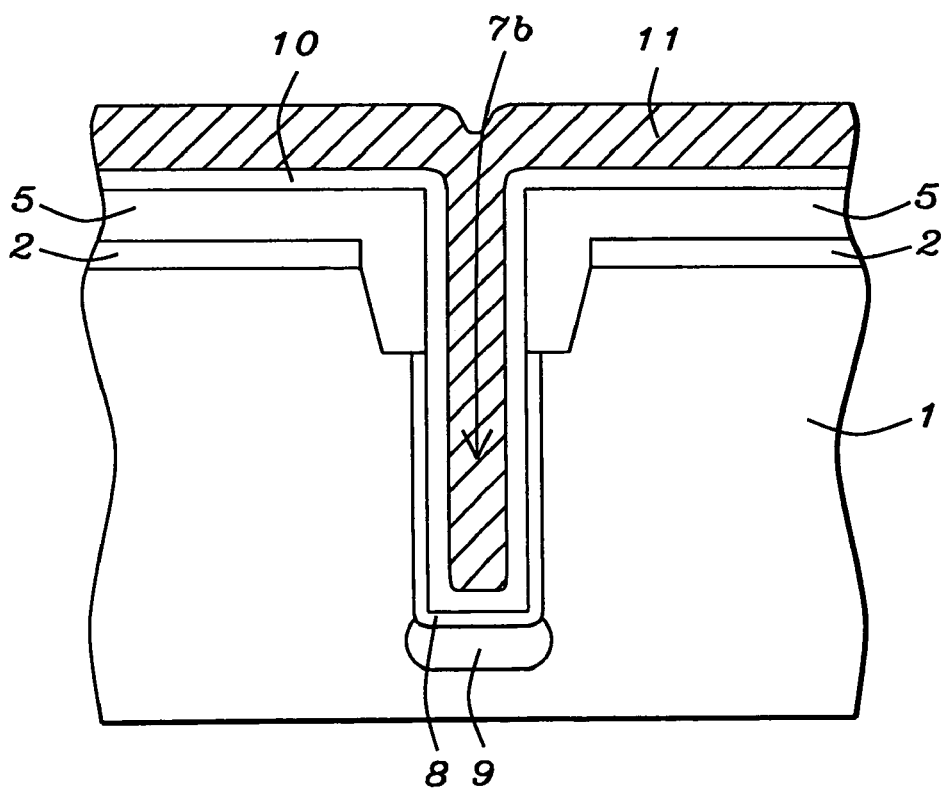

Silicon oxide layer 10, is next deposited via LPCVD or PECVD procedures, to a thickness between about 500 to 3000 Angstroms, using TEOS as a source. A first portion of silicon oxide layer 10, is deposited on the sides and bottom of deep trench shape 7b, either on silicon dioxide layer 8, or on the sides of silicon oxide layer 5, not however completely filling deep trench shape 7b. A second portion of silicon oxide layer 10, is also deposited overlying the top surface of silicon oxide layer 5, in an active device region, or a region not occupied by the insulator filled, shallow trench shape. Polysilicon layer 11, is next deposited via LPCVD procedures at a thickness between about 7000 to 20,000 Angstroms, completely filling deep trench shape 7b, as well as overlying the portion of silicon oxide layer 10, located overlying a subsequent active device region. This is schematically illustrated in FIG. 7. If desired another conductive layer, such as tungsten or metal silicide such as tungsten silicide, can be used in place of polysilicon.

Figure 8:
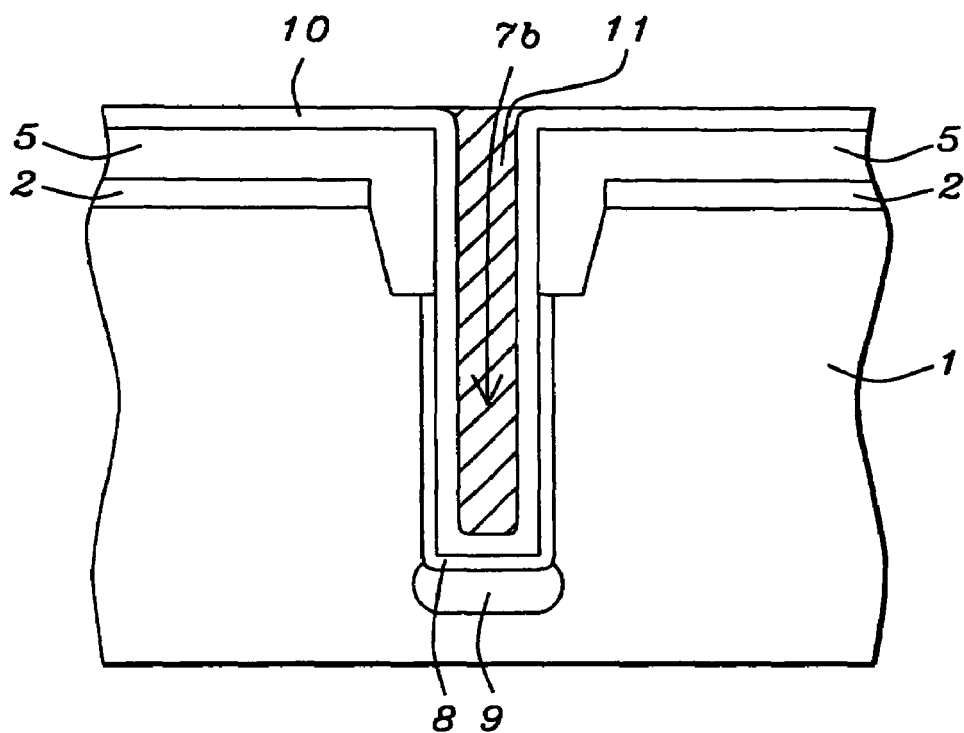

A polysilicon etch back procedure is next employed to selectively remove portions of polysilicon layer 11, from the top surface of silicon oxide layer 10, resulting in a polysilicon filled deep trench shape. The polysilicon etch back procedure is performed via a RIE procedure, using $Cl_2$ as a selective etchant for polysilicon, terminating or slowing at the appearance of the top surface of silicon oxide layer 10. If desired a CMP procedure can be used to selectively remove portions of polysilicon layer 11, from the top surface of silicon oxide layer 10. This is schematically illustrated in FIG. 8.

Figure 9:
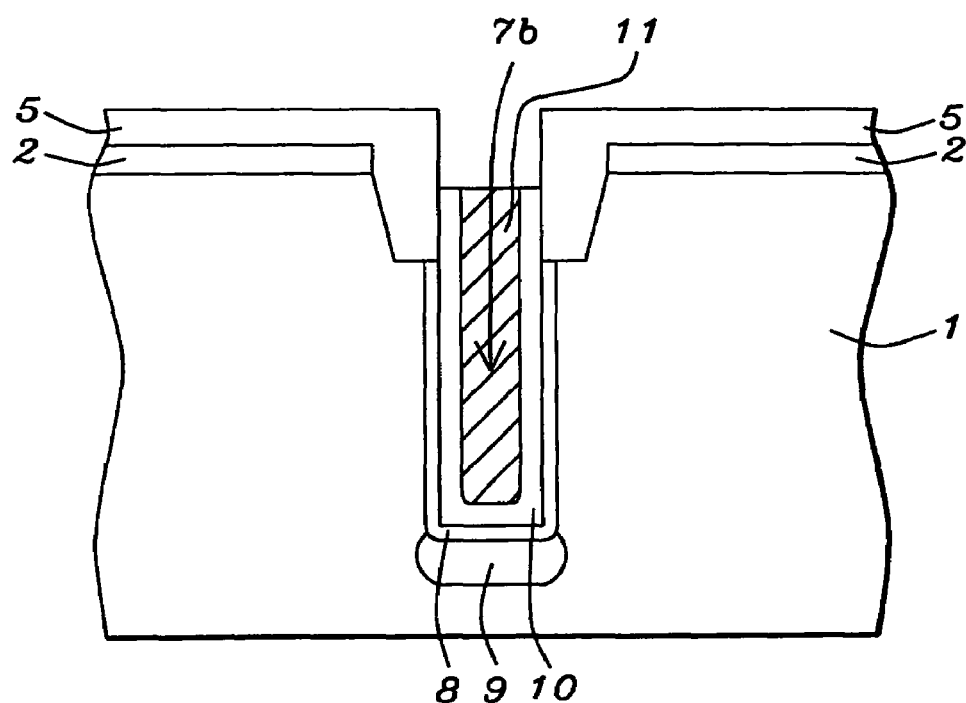

Recessing of polysilicon layer 11, to a depth between about 1000 to 5000 Angstroms below the top surface of silicon oxide layer 5, is next addressed. This is accomplished via selective dry etch procedures, using $Cl_2$ as an etchant for polysilicon, or via selective wet etch procedures. The top surface of the recessed polysilicon shape is now located below the top surface of the insulator layer filled, shallow trench shape. Removal of portions of silicon oxide layer 10, exposed on the sides of deep trench shape 7b, as well as on the top surface of silicon oxide layer 5, are removed via wet etch procedures using a buffered hydrofluoric acid solution. This is schematically shown in FIG. 9.

Figure 10:
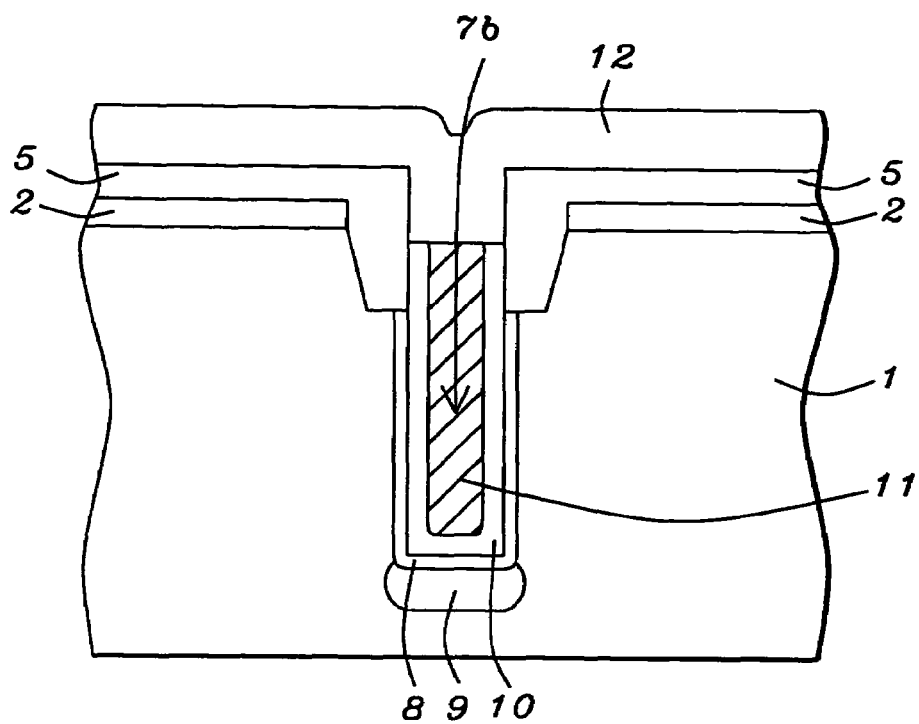

Recessing of polysilicon layer 11, creates a space which is now filled with silicon oxide layer 12, obtained via HDP procedures at a thickness between about 1000 to 8000 Angstroms. The recessing of polysilicon, followed by refilling with HDP silicon oxide, will subsequently allow a more planar top surface of isolation to be obtained when compared to counterpart isolation regions defined without the polysilicon recessing and silicon oxide fill. In addition, the recessing and burying of polysilicon reduces the risk of a polysilicon fill located above the top surface the deep trench opening, possibly communicating with other conductive structures via rails formed during dry etching definition of other conductive structures located in adjacent active device regions. Silicon oxide layer 12, also deposits on the top surface of silicon oxide layer 5, in regions in which silicon oxide layer 5, overlays subsequent active device regions. This is schematically shown in FIG. 10.

Figure 11:
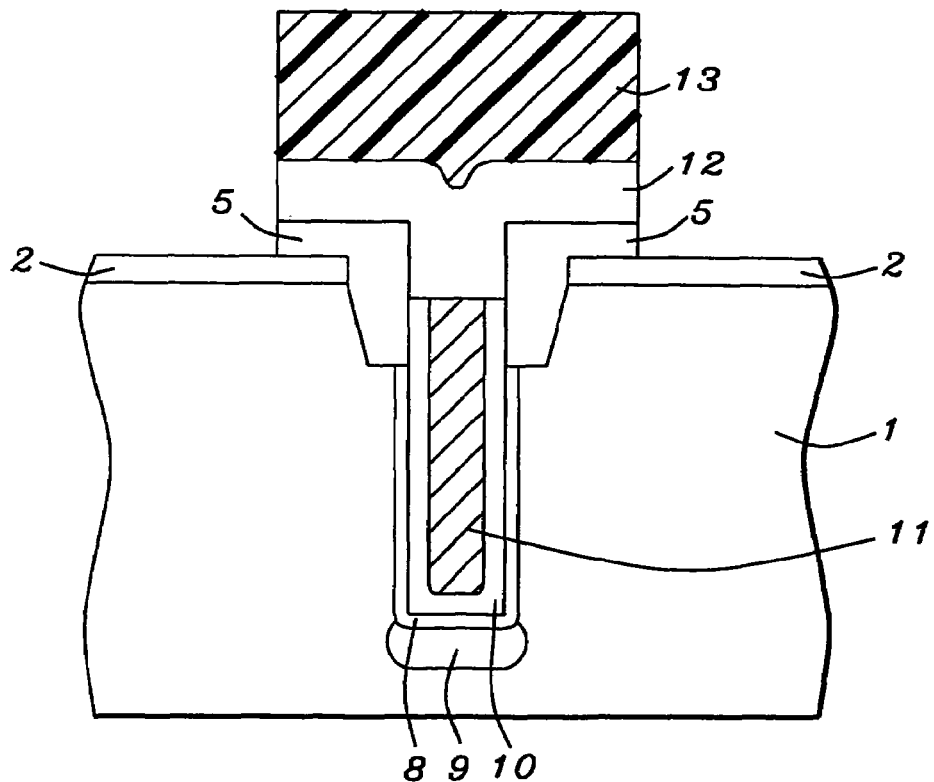

Photoresist shape 13, is next defined using a photolithographic plate with the reverse tone of the photolithographic plate previously as a mask for definition of the shallow trench shape. If desired the same photolithographic plate used to define the shallow trench shape can again be used with an opposite polarity, or a negative photoresist layer. Photoresist shape 13, overlays the isolation regions as well as overlying portions of silicon oxide layer 12, located adjacent to the isolation regions. An anisotropic RIE procedure, using $CHF_3$ as an etchant, is next used to selectively remove exposed portions of silicon oxide layer 12, and to remove underlying portions of silicon oxide layer 5, exposing the top surface of silicon nitride layer 2. An insulator stack, comprised of silicon oxide layer 12, and underlying silicon oxide layer 5, is now located overlying the isolation region as well as overlying portions of silicon nitride layer 2, located adjacent to the isolation regions. This is schematically shown in FIG. 11.

Figure 12:
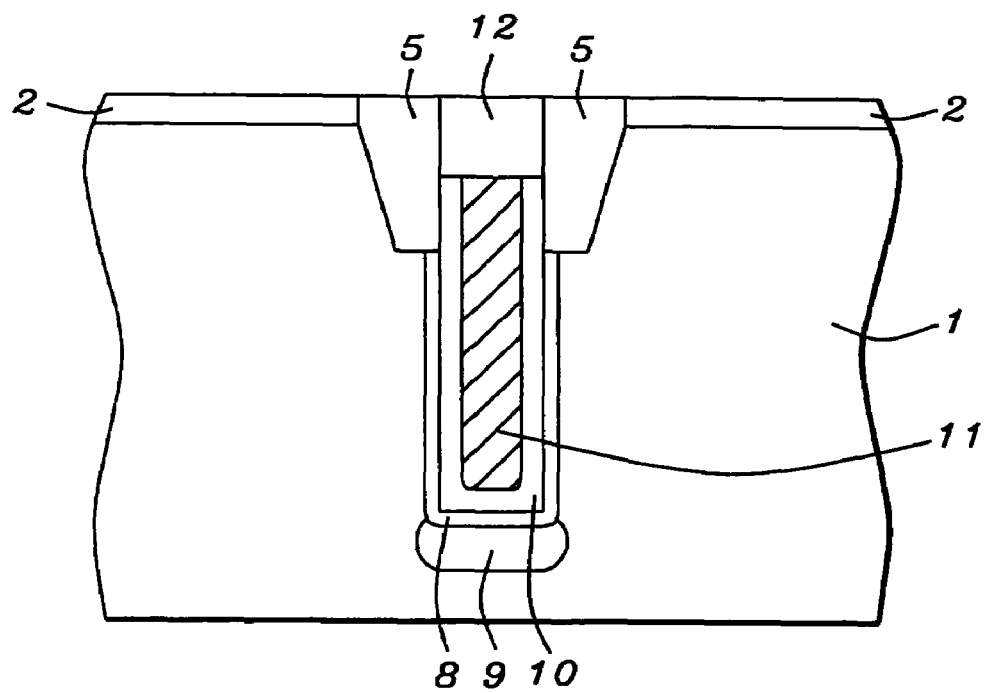

After removal of photoresist shape 13, via plasma oxygen ashing, a CMP procedure is again employed to remove the top portion of the silicon oxide layer 12, silicon oxide layer 5, insulator stack, with the CMP procedure selectively terminating at the appearance of the top portion of silicon nitride layer 2 that was located underlying the insulator stack. The result of the CMP procedure is a flat, smooth top surface topography comprised of active device regions and comprised of a shallow trench-deep trench isolation region in which the deep trench shape features a silicon oxide plug located overlying a recessed polysilicon plug, and wherein the shallow trench shape surrounding the deep trench shape is filled with silicon oxide layer 5. This is schematically shown in FIG. 12. If desired, deep trench shape 7b can be completely filled with an insulator layer such as silicon oxide, instead of with the insulator plug and recessed polysilicon plug.

Figure 13:
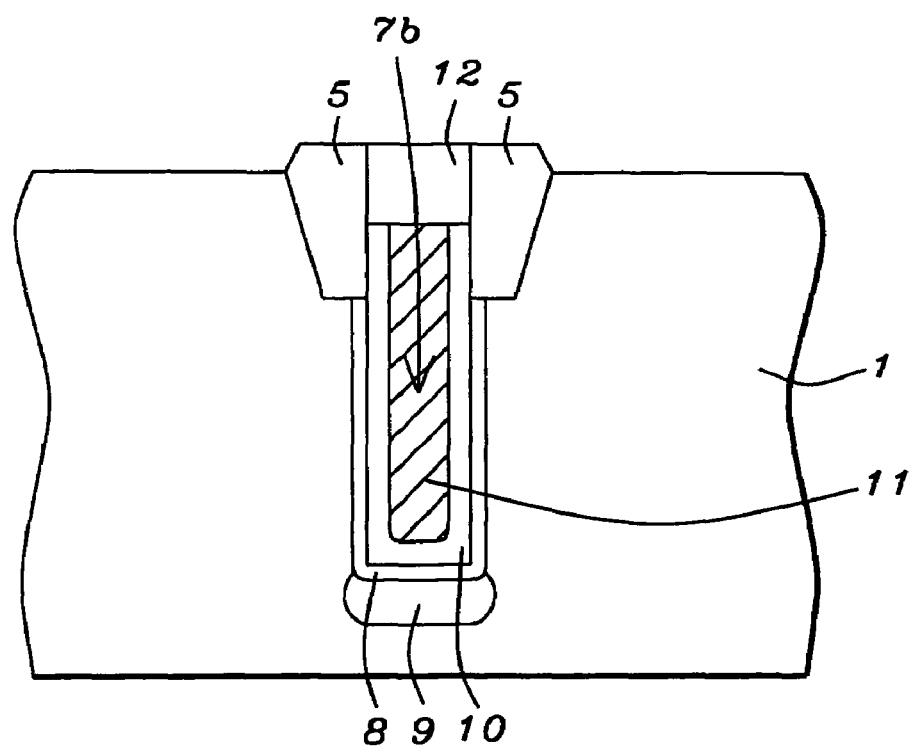

Removal of silicon nitride layer 2 is next accomplished selectively via use of a hot phosphoric acid solution, exposing regions of semiconductor substrate 1, to be used as active device regions. This is schematically shown in FIG. 13. The smooth top surface of the shallow trench-deep trench isolation region allows fabrication of active device elements to be realized without the risk of leakage inducing rail formation. The smooth top surface topography also improves the ability to define sub-micron features via photolithographic procedures. In addition, the depth of the deep trench region allows isolation of bipolar elements, such as buried sub-collector regions, to be easily accomplished.

While this invention has been particularly shown and described with reference to, the preferred embodiments thereof, it will be understood by those skilled in the art that various changes in form and details may be made without departing from the spirit and scope of this invention.

What is claimed is:

1. A trench structure in a semiconductor substrate, comprising:
   a silicon oxide filled shallow trench located in a first portion of the semiconductor substrate and having a depth ranging between about 1100 Angstroms and about 2000 Angstroms;
   a deep trench located in the insulator filled shallow trench and extending into an underlying second portion of the semiconductor substrate, wherein the deep trench has a depth ranging between about 4 um and about 10 um and a diameter ranging between about 0.5 um and about 1.6 um;
   a channel stop region located in a third portion of the semiconductor substrate that is directly underlying the deep trench;
   insulator sidewalls located on sides of a bottom portion of the deep trench;
   a polysilicon region located in the bottom portion of the deep trench and interfacing the insulator sidewalls; and
   a insulator located in a top portion of the deep trench and overlying the polysilicon region, wherein sides of the insulator interface the insulator filled shallow trench, and wherein the insulator comprises silicon oxide.

2. A trench structure in a semiconductor substrate, comprising:
   a silicon oxide filled shallow trench located in a first portion of the semiconductor substrate and having a depth ranging between about 1100 Angstroms and about 2000 Angstroms; and
   a deep trench located in the insulator filled shallow trench and extending into an underlying second portion of the semiconductor substrate, wherein the deep trench has a depth ranging between about 4 um and about 10 um and a diameter ranging between about 0.5 um and about 1.6 um.

3. The trench structure of claim 2 further comprising a channel stop region located in a third portion of the semiconductor substrate that is directly underlying the deep trench.

4. The trench structure of claim 3 further comprising insulator sidewalls located on sides of a bottom portion of the deep trench.

5. The trench structure of claim 4 further comprising a conductive region located in the bottom portion of the deep trench and interfacing the insulator sidewalls.

6. The trench structure of claim 5 wherein the conductive region is recessed to a depth ranging between about 1000 Angstroms and about 5000 Angstroms below the top surface of the insulator filled shallow trench shape.

7. The trench structure of claim 5 further comprising an insulator layer located in a top portion of the deep trench and overlying the conductive region, wherein sides of the insulator layer interface the insulator filled shallow trench.

8. The trench structure of claim 7 wherein the insulator layer comprises silicon dioxide.

9. The trench structure of claim 7 wherein the insulator layer has a thickness ranging between about 50 Angstroms and about 1000 Angstroms.

10. The trench structure of claim 7 wherein the insulator layer has a smooth top surface topography.

11. The trench structure of claim 2 wherein a region located in a third portion of the semiconductor substrate that is directly underlying the bottom of the deep trench shape is a P type channel stop region.

12. The trench structure of claim 2 further comprising:
    a channel stop region located in a third portion of the semiconductor substrate that is directly underlying the deep trench;
    insulator sidewalls located on sides of a bottom portion of the deep trench;
    a conductive region located in the bottom portion of the deep trench and interfacing the insulator sidewalls, wherein the conductive region is recessed to a depth ranging between about 1000 Angstroms and about 5000 Angstroms below the top surface of the insulator filled shallow trench shape; and
    an insulator layer located in a top portion of the deep trench and overlying the conductive region, wherein sides of the insulator layer interface the insulator filled shallow trench, wherein the insulator layer comprises silicon dioxide, wherein the insulator layer has a thickness ranging between about 50 Angstroms and about 1000 Angstroms, and wherein the insulator layer has a smooth top surface topography;
    wherein a region located in a third portion of the semiconductor substrate that is directly underlying the bottom of the deep trench shape is a P type channel stop region.

* * * * *